United States Patent
Hirayama

(10) Patent No.: US 8,437,598 B2
(45) Date of Patent: May 7, 2013

(54) RESIN COMPOSITION FOR PRODUCTION OF OPTICAL WAVEGUIDE, AND OPTICAL WAVEGUIDE PRODUCED BY USING THE RESIN COMPOSITION

(75) Inventor: Tomoyuki Hirayama, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 246 days.

(21) Appl. No.: 13/098,699

(22) Filed: May 2, 2011

(65) Prior Publication Data

US 2011/0280531 A1 Nov. 17, 2011

(30) Foreign Application Priority Data

May 11, 2010 (JP) ................................. 2010-109631

(51) Int. Cl.
*G02B 6/00* (2006.01)
*G02B 6/10* (2006.01)

(52) U.S. Cl.
USPC ............ 385/141; 385/132; 385/143; 385/145

(58) Field of Classification Search .................. 385/132, 385/141, 143, 145
See application file for complete search history.

(56) References Cited

U.S. PATENT DOCUMENTS

| 5,565,537 | A * | 10/1996 | Uda et al. ....................... 526/262 |
| 7,601,484 | B2 * | 10/2009 | DeVoe et al. .................. 430/321 |
| 2005/0141839 | A1 * | 6/2005 | Shelnut et al. ................. 385/129 |
| 2009/0186966 | A1 * | 7/2009 | Gallucci et al. ................. 524/96 |
| 2010/0119835 | A1 * | 5/2010 | Messe et al. ................... 428/414 |

FOREIGN PATENT DOCUMENTS

| JP | 2001-281475 A | 10/2001 |
| JP | 2005-154715 A | 6/2005 |

* cited by examiner

*Primary Examiner* — Charlie Peng
(74) *Attorney, Agent, or Firm* — Westerman, Hattori, Daniels & Adrian, LLP

(57) ABSTRACT

A resin composition is provided, which satisfies both an uncured layer flexibility requirement and a patterning resolution requirement for production of an optical waveguide by a roll-to-roll process. An optical waveguide produced by using the resin composition is also provided. The resin composition comprises: (A) an aromatic multifunctional epoxy polymer having a weight average molecular weight (Mw) of 500 to 5000; (B) an aromatic multifunctional epoxy polymer having a weight average molecular weight (Mw) of 10000 to 50000; (C) at least one of monofunctional, difunctional and trifunctional liquid aromatic epoxy monomers; and (D) a photoacid generator; wherein the components (A), (B) and (C) are present in proportions of 80 to 90 parts by weight, 5 to 15 parts by weight, and 1 to 10 parts by weight, respectively, based on a total of 100 parts by weight of the components (A), (B) and (C).

3 Claims, No Drawings

RESIN COMPOSITION FOR PRODUCTION OF OPTICAL WAVEGUIDE, AND OPTICAL WAVEGUIDE PRODUCED BY USING THE RESIN COMPOSITION

BACKGROUND OF THE INVENTION

1. Field of the Invention

The present invention relates to a resin composition for production of an optical waveguide, and to an optical waveguide produced by using the resin composition.

2. Description of the Related Art

An optical waveguide typically includes a core portion and a cladding portion. With a difference in refractive index between the core portion and the cladding portion, the core portion serves as a light passage for transmission of a light signal. Exemplary materials for conventional optical waveguides include inorganic materials such as quartz glass and silicon, and organic materials such as highly pure polyimide resins, polyamide resins and polyether resins.

In recent years, various optical waveguide production methods have been developed, in which a photosensitive resin solution (photosensitive monomer mixture solution) is used as an optical waveguide material, and the core portion of the optical waveguide is formed by forming a coating layer of the solution and photo-curing the coating layer by irradiation of the coating layer with ultraviolet radiation via a mask of a predetermined pattern for easy production of the optical waveguide (see, for example, JP-A-2001-281475).

However, the photosensitive resin solution conventionally used in the aforementioned application has a higher photo-curing sensitivity, and the coating layer (uncured layer) of the photosensitive resin solution has a tacky surface (or has surface tackiness). This makes it difficult to employ a continuous process such as a roll-to-roll process using a multi-coater or a like coating machine. In the roll-to-roll process, the coating layer is wound up to be brought into contact with a previously wound portion thereof, whereby the previously wound portion and the newly wound portion of the coating layer adhere to each other. This may result in breakage of the adhering portions of the coating layer.

Where the roll-to-roll process is employed for the formation of the coating layer, a so-called "ordinary-temperature solid polymer resin" which is in a solid phase at an ordinary temperature is used for the photosensitive resin solution (see, for example, JP-A-2005-154715).

Where the aforementioned ordinary-temperature solid polymer resin to be used has a higher molecular weight, however, an uncured layer of the resin (an amorphous film before the curing) has higher flexibility, but disadvantageously has lower patterning resolution. If the resin has a lower molecular weight, on the other hand, the patterning resolution is higher, but the flexibility is lower.

Thus, there is a trade-off relationship between the flexibility and the patterning resolution of the uncured layer. For this reason, an optical waveguide material suitable for the roll-to-roll process including the winding step is not provided yet. Accordingly, there is an eager demand for an optical waveguide material satisfying both the film flexibility requirement and the patterning resolution requirement.

SUMMARY OF THE INVENTION

A resin composition is disclosed satisfies both the uncured layer flexibility requirement and the patterning resolution requirement for production of an optical waveguide by a roll-to-roll process, and provides an optical waveguide produced by using the resin composition.

According to a first aspect, there is provided a resin composition for production of an optical waveguide, the resin composition comprising: (A) an aromatic multifunctional epoxy polymer having a weight average molecular weight (Mw) of 500 to 5000; (B) an aromatic multifunctional epoxy polymer having a weight average molecular weight (Mw) of 10000 to 50000; (C) at least one of monofunctional, difunctional and trifunctional liquid aromatic epoxy monomers; and (D) a photoacid generator; wherein the components (A), (B) and (C) are present in proportions of 80 to 90 parts by weight, 5 to 15 parts by weight, and 1 to 10 parts by weight, respectively, based on a total of 100 parts by weight of the components (A), (B) and (C).

According to a second aspect, there is provided an optical waveguide, which comprises a core portion for transmission of a light signal, and a cladding portion, at least one of the cladding portion and the core portion being formed from the resin composition according to the first aspect.

Intensive studies and various experiments were conducted, during which an idea of adding a liquid epoxy monomer to a base polymer including a higher molecular weight multifunctional epoxy polymer and a lower molecular weight multifunctional epoxy polymer was conceived. As a result, it was found that a resin composition prepared by mixing the components (A) to (D) in the specific proportions satisfies both the uncured layer flexibility requirement and the patterning resolution requirement without tackiness.

Such an effect is created supposedly for the following reason. The higher molecular weight multifunctional epoxy polymer (B) supposedly serves as a reactive binder for imparting flexibility to the lower molecular weight multifunctional epoxy polymer (A) and the liquid epoxy monomer (C) each having certain reactivity. Thus, the uncured layer of the resin composition is imparted with higher flexibility while maintaining reactivity. Since the resin composition for the production of the optical waveguide contains the liquid monomer component in a proportion within the specific range, the uncured layer is free from tackiness and properly curable.

As described above, the resin composition for the production of the optical waveguide contains the aromatic multifunctional epoxy polymer (A) having a weight average molecular weight in the specific lower molecular weight range, the aromatic multifunctional epoxy polymer (B) having a weight average molecular weight in the specific higher molecular weight range, at least one (C) of the monofunctional, difunctional and trifunctional liquid aromatic epoxy monomers, and the photoacid generator (D) in proportions within the aforementioned specific ranges. Therefore, both the uncured layer flexibility requirement and the higher patterning resolution requirement are satisfied without the tackiness. Accordingly, the resin composition is suitable for the roll-to-roll process and other continuous processes.

DETAILED DESCRIPTION OF THE INVENTION

The present invention will hereinafter be described by way of embodiments thereof.

A resin composition for production of an optical waveguide is prepared by mixing: (A) an aromatic multifunctional epoxy polymer having a weight average molecular weight (Mw) of 500 to 5000; (B) an aromatic multifunctional epoxy polymer having a weight average molecular weight (Mw) of 10000 to 50000; (C) at least one of monofunctional, difunctional and trifunctional liquid aromatic epoxy monomers; and (D) a photoacid generator. In the resin composition, the components (A), (B) and (C) are present in proportions of 80 to 90 parts by weight, 5 to 15 parts by weight, and 1 to 10 parts by weight, respectively, based on a total of 100 parts by weight of the components (A), (B) and (C). The term "parts by weight" will hereinafter be referred to simply as "parts" for convenience.

As described above, the epoxy polymer (A) is a multifunctional epoxy polymer having an aromatic ring in its molecule and having a weight average molecular weight (Mw) of 500 to 5000. Specific examples of such a multifunctional epoxy polymer include 157S70 (available from Japan Epoxy resins Co., Ltd.) and YDCN-700-10 (available from Tohto Kasei Co., Ltd.), which may be used either alone or in combination.

As described above, the epoxy polymer (B) is a multifunctional epoxy polymer having an aromatic ring in its molecule and having a weight average molecular weight (Mw) of 10000 to 50000. Specific examples of such a multifunctional epoxy polymer include MARPROOF G-02505, MARPROOF G-0250SP and MARPROOF G-0130SP (available from NOF Corporation), which may be used either alone or in combination.

As described above, the weight average molecular weight (Mw) of the epoxy polymer (A) is typically 500 to 5000, preferably 800 to 2000. The weight average molecular weight (Mw) of the epoxy polymer (B) is typically 10000 to 50000, preferably 15000 to 30000. Where the epoxy polymers (A) and (B) respectively have weight average molecular weights within the aforementioned specific ranges, the resin composition has a higher flexibility in an uncured state while maintaining its reactivity.

The liquid epoxy monomer (C) to be used together with the components (A) and (B) is at least one of the monofunctional, difunctional and trifunctional liquid epoxy monomers each having an aromatic ring in its molecule. Specific examples of such liquid epoxy monomers include JER828, JER827, JER152 and JER630 (each available from Japan Epoxy Resin Co., Ltd.), which may be used either alone or in combination.

In the resin composition, as described above, the components (A), (B) and (C) should be present in proportions of 80 to 90 parts, 5 to 15 parts, and 1 to 10 parts, respectively, based on a total of 100 parts of the components (A), (B) and (C). Preferably, the components (A), (B) and (C) are present in proportions of 83 to 87 parts, 8 to 12 parts, and 4 to 6 parts, respectively, based on a total of 100 parts of the components (A), (B) and (C). If the proportion of the component (A) is less than the aforementioned range, the patterning resolution is reduced. If the proportion of the component (A) is greater than the aforementioned range, on the other hand, the flexibility of the resin composition in the uncured state is reduced. If the proportion of the component (B) is less than the aforementioned range, the flexibility of the resin composition in the uncured state is reduced. If the proportion of the component (B) is greater than the aforementioned range, on the other hand, the patterning resolution is reduced. If the proportion of the component (C) is less than the aforementioned range, the patterning resolution is reduced. If the proportion of the component (C) is greater than the aforementioned range, on the other hand, the resin composition is liable to suffer from tackiness.

The resin composition may further contain an oxetane monomer. In this case, the oxetane monomer may be present in a proportion of not greater than 70 wt % based on the total weight of the liquid aromatic epoxy monomer (C) and the oxetane monomer. The combinational use of the epoxy monomer and the oxetane monomer improves the curing speed and the patterning resolution. Specific examples of the oxetane monomer include 1,4-bis{[(3-ethyl-3-oxetanyl)methoxy]methyl}benzene, di[2-(3-oxetanyl)butyl]ether, 3-ethyl-3-phenoxymethyloxetane, 3-ethyl-3-hydroxymethyloxetane, 1,4-bis[(3-ethyloxetan-3-yl)methoxy]benzene, 1,3-bis[(3-ethyloxetan-3-yl)methoxy]benzene, 1,2-bis[(3-ethyloxetan-3-yl)methoxy]benzene, 4,4'-bis[(3-ethyloxetan-3-yl)methoxy]biphenyl, 2,2'-bis[(3-ethyl-3-oxetanyl)methoxy]biphenyl, 3,3',5,5'-tetramethyl[4,4'-bis(3-ethyloxetan-3-yl)methoxy]biphenyl, 2,7-bis[(3-ethyloxetan-3-yl)methoxy]naphthalene, 1,6-bis[(3-ethyloxetan-3-yl)methoxy]-2,2,3,3,4,4,5,5-octafluorohexane, 3(4),8(9)-bis[(1-ethyl-3-oxetanyl)methoxymethyl]-tricyclo[5.2.1.2.6]decane, 1,2-bis{[2-(1-ethyl-3-oxetanyl)methoxy]ethylthio}ethane, 4,4'-bis[(1-ethyl-3-oxetanyl)methyl]thiobenzene thioether, 2,3-bis[(3-ethyloxetan-3-yl)methoxymethyl]norbornane, 2-ethyl-2-[(3-ethyloxetan-3-yl)methoxymethyl]-1,3-O-bis[(1-ethyl-3-oxetanyl)methyl]-propane-1,3-diol, 2,2-dimethyl-1,3-O-bis[(3-ethyloxetan-3-yl)methyl]-propane-1,3-diol, 2-butyl-2-ethyl-1,3-O-bis[(3-ethyloxetan-3-yl)methyl]-propane-1,3-diol, 1,4-O-bis[(3-ethyloxetan-3-yl)methyl]-butane-1,4-diol and 2,4,6-O-tris[(3-ethyloxetan-3-yl)methyl]cyanurate, which may be used either alone or in combination.

The photoacid generator (D) to be used together with the components (A) to (C) is capable of generating an acid which is cationically polymerizable by irradiation with ultraviolet radiation. Examples of the photoacid generator include onium salts (diazonium salts, sulfonium salts, iodonium salts, selenonium salts, pyridinium salts, ferrocenium salts and phosphonium salts), which each contain an anion component such as $SbF_6^-$, $PF_6^-$, $BF_4^-$, $AsF_6^-$, $(C_6F_5)_4^-$ or $PF_4(CF_2CF_3)_2^-$, and a cation component. These onium salts may be used either alone or in combination. Particularly, onium salts containing $SbF_6^-$ or $PF_4(CF_2CF_3)_2^-$ as the anion component are preferred for curability and transparency. For anion production rate, aromatic sulfonium salts are preferred, and triarylsulfonium salts are particularly preferred.

From the viewpoint of curability and patterning resolution, it is preferred to blend the photoacid generator (D) in a proportion of 2 to 6 parts, more preferably 3 to 4 parts, based on a total of 100 parts of the components (A) to (C).

As required, the resin composition may contain a solvent in addition to the aforementioned components (A) to (D). Examples of the solvent include polar solvents including esters such as ethyl lactate, methyl acetate and butyl acetate, ketones such as acetone, methyl ethyl ketone and methyl isobutyl ketone, dimethylformamide and dimethyl sulfoxide, halogen-containing solvents such as 1,1,1-trichloroethane and chloroform, ethers such as tetrahydrofuran and dioxane, aromatic solvents such as benzene, toluene and xylene, and fluorinated inert liquids such as perfluorooctane and perfluorotri-n-butylamine. The solvent is typically used in a proportion of 0 to about 200 parts based on a total of 100 parts of the components (A) to (D).

In the resin composition, additives such as a leveling agent, an adhesiveness imparting agent, a flexibility imparting agent, an antioxidant and a defoaming agent may be added to the components (A) to (D) as required. These additives may be used either alone or in combination. These additives are preferably used in a total proportion of not greater than 5 wt % based on the overall weight of the resin composition so as not to impair the effects of the embodiment.

The resin composition (varnish) for the production of the optical waveguide can be prepared by mixing the resin components (A) to (C) optionally with the solvent, heating the resulting mixture to 40° C. to 100° C. to provide a solution, cooling the solution to a room temperature, and mixing the photoacid generator (D) with the solution.

The resin composition (varnish) preferably has a viscosity of 1000 to 3000 mPa·s (at 25° C.), more preferably 1500 to 2500 mPa·s (at 25° C.). The viscosity is measured, for example, by means of a Brookfield's viscometer (DV-I+).

An optical waveguide produced by using the resin composition (varnish) described above, for example, has the following construction. The optical waveguide includes a core portion for transmission of a light signal, and a cladding portion. At least one of the core portion and the cladding portion is formed from the resin composition described above. The core portion has a predetermined pattern (optical waveguide pattern). The cladding portion should have a smaller refractive index than the core portion. A difference in refractive index between the core portion and the cladding portion can be controlled by employing ingredients in different proportions or employing different materials for the cladding portion and the core portion.

The optical waveguide may be constructed such that a cladding layer (under-cladding layer) is provided as a base, and the core portion having the predetermined pattern is provided on the base and exposed in air. In this case, the refractive index of the core portion is set higher than that of the air for preventing the scattering of light from the core portion. Alternatively, the optical waveguide may be constructed such that the core portion having the predetermined pattern is provided on an under-cladding layer provided separately from a base and an over-cladding layer is provided over the core portion.

The optical waveguide can be produced, for example, in the following manner by a roll-to-roll process. In the roll-to-roll process, the resin composition (varnish) described above is applied onto a flexible base paid out from a first roll, and thermally dried to form an uncured layer (coating layer) on the base. Then, the resulting flexible base is taken up around a second roll. Subsequently, the flexible base is paid out from the second roll, and the uncured layer on the flexible base is irradiated in a predetermined pattern with ultraviolet radiation and heat-treated at 60° C. to 150° C. for 5 to 30 minutes. Thus, a portion of the uncured layer irradiated with the ultraviolet radiation is cured to form a core portion of the optical waveguide. In turn, the resulting flexible base is taken up around a third roll. Subsequently, the flexible base is paid out from the third roll, and a remaining uncured portion of the layer (not irradiated with the ultraviolet radiation) on the flexible base is dissolved away with a developing liquid (by a spray developing method). Then, the resulting flexible base is taken up around a fourth roll. Thus, the optical waveguide is produced. The resin composition satisfies both the uncured layer flexibility requirement and the higher patterning resolution requirement without the tackiness and, therefore, is advantageously employed for the roll-to-roll process which includes the winding steps. This results in higher productivity.

For the formation of the core portion, the uncured layer is irradiated in the predetermined pattern (optical waveguide pattern) with the ultraviolet radiation via a photomask to be thereby exposed to the ultraviolet radiation. Exemplary light sources for the irradiation include a low pressure mercury lamp, a high pressure mercury lamp, an ultra high pressure mercury lamp and a xenon lamp. The dose for the irradiation is preferably 100 to 3000 mJ/cm$^2$.

The exposed portion of the coating layer resulting from the irradiation with the ultraviolet radiation serves as the core portion. The unexposed portion of the coating layer (not irradiated with the ultraviolet radiation) is dissolved away with the developing liquid. Alternatively, the unexposed portion of the coating layer may be thermally cured, for example, by a heat treatment to form the cladding portion of the optical waveguide.

Examples of the flexible base include a photo-curable epoxy film, a polyethylene terephthalate (PET) film, a polyethylene naphthalate film, a polyimide film, and metal foils such as a copper foil and a stainless foil. The flexible base typically has a thickness of 10 μm to 5 mm.

The flexible base per se may serve as a cladding layer. As required, an under-cladding layer may be formed on the flexible base, and then the core portion may be formed on the under-cladding layer. As required, an over-cladding layer may be formed over the core portion. More specifically, a cladding material is applied on the flexible base to form a coating film, which is in turn cured to form the under-cladding layer. Then, a core material is applied on the under-cladding layer to form a coating film, which is in turn exposed in a predetermined pattern to ultraviolet radiation to be thereby cured. Thereafter, an uncured portion of the coating film is dissolved away with a developing liquid, whereby the core portion is formed. Further, the cladding material is applied over the core portion and cured to form the over-cladding layer. Thus, the optical waveguide is produced. It is noted that the curing for the formation of the under-cladding layer and the over-cladding layer may be achieved by a heat treatment or by irradiation with ultraviolet radiation.

In the production of the optical waveguide, the formation of the coating film may be achieved by the roll-to-roll process, or by a coating method using a spin coater, a coater, a disk coater or a bar coater, a screen printing method or an electrostatic coating method.

If the roll-to-roll process is not employed, a nonflexible base such as a quartz glass plate, a silicon wafer, a ceramic plate or a glass epoxy resin plate may be used.

The base may be removed from the optical waveguide produced in the aforesaid manner. In this case, the optical waveguide can be provided in a film form. With this arrangement, the optical waveguide is more excellent in flexibility.

The optical waveguide may be used as a linear optical waveguide, a curved optical waveguide, a cross optical waveguide, a Y-branched optical waveguide, a slab optical waveguide, a Mach-Zehnder optical waveguide, an AWG optical waveguide, a grating or an optical waveguide lens. Exemplary optical devices employing any of these optical waveguides include a wavelength filter, an optical switch, an optical demultiplexer, an optical multiplexer, an optical multiplexer/demultiplexer, an optical amplifier, a wavelength modulator, a wavelength divider, an optical splitter, a directional coupler, and an optical transmission hybrid module including a laser diode and a photo diode in combination.

EXAMPLES

Next, inventive examples will be described in conjunction with comparative examples. However, the present invention is not limited to these inventive examples.

Prior to the description of the inventive examples and the comparative examples, ingredients employed in these examples will be described below.

Lower Molecular Weight Epoxy Polymer A1 (Component (A))

Aromatic multifunctional epoxy polymer 157S70 available from Japan Epoxy Resin Co., Ltd., and having Mw of 900

Lower Molecular Weight Epoxy Polymer A2 (Component (A))

Aromatic multifunctional epoxy polymer YDCN-700-10 available from Tohto Kasei Co., Ltd., and having Mw of 1400

Higher Molecular Weight Epoxy Polymer B1 (Component (B))

Aromatic multifunctional epoxy polymer MARPROOF G-0250SP available from NOF Corporation, and having Mw of 20000

Higher Molecular Weight Epoxy Polymer B2 (Component (B))

Aromatic multifunctional epoxy polymer MARPROOF G-0130SP available from NOF Corporation, and having Mw of 10000

Liquid Epoxy Monomer (Component (C))

Difunctional aromatic epoxy monomer JER828 available from Japan Epoxy Resin Co., Ltd.

Oxetane Monomer

Tris P-RK-OX available from Honshu Chemical Industry Co., Ltd.

Ethyl Lactate (solvent)

Ethyl lactate available from Wako Pure Chemical Industries, Ltd.

Photoacid Generator (Component (D))

CPI-200K available from San-Apro Ltd.

Example 1

First, 10 g of the higher molecular weight multifunctional epoxy polymer B1, 85 g of the lower molecular weight multifunctional epoxy polymer A1 and 5 g of the liquid epoxy monomer were mixed and completely dissolved in 55 g of ethyl lactate with heating at a temperature of 85° C. Thereafter, the resulting mixture was cooled to room temperature, and mixed with 4 g of the photoacid generator. Thus, a resin composition (varnish) for production of an optical waveguide was prepared.

The varnish thus prepared was applied on a photo-curable epoxy film (having a thickness of 15 μm) by means of an applicator (with an applicator gap of 120 μm), and thermally dried at 150° C. in a drying oven for 3 minutes. Thus, an uncured core film layer was formed on the epoxy film. Subsequently, the uncured core film layer was exposed to ultraviolet radiation (i-line radiation) via a photomask at 2000 mJ/cm$^2$ by an exposing device and then heated at 100° C. for 10 minutes to be thereby partly cured. Thereafter, the core film layer was developed with γ-butyrolactone by means of a spray developing device, and rinsed with water and dried. Thus, the core film layer was patterned to form an optical waveguide pattern (core layer). The core layer pattern had a projection width of 15 μm and a recess (groove) width of 15 μm in section, and an aspect ratio (vertical-to-horizontal dimensional ratio) of about 3.

Examples 2 to 7 and Comparative Examples 1 to 6

Resin compositions (varnishes) for production of optical waveguides were each prepared in substantially the same manner as in Example 1, except that the respective ingredients were blended in different proportions as shown in Tables 1 and 2. Then, optical waveguide patterns were formed in substantially the same manner as in Example 1, except that the varnishes thus prepared were used.

The resin compositions of Examples 1 to 7 and Comparative Examples 1 to 6 were evaluated based on the following criteria. The results of the evaluation are also shown in Tables 1 and 2.

Flexibility

The photo-curable epoxy film formed with the uncured core film layer yet to be irradiated with the ultraviolet radiation was bent (with a radius R of 1 cm) with the uncured core film layer facing outward. An uncured core film layer free from cracking during the bending was rated as excellent (○), and an uncured core film layer suffering from cracking during the bending was rated as unacceptable (x). An uncured core film layer suffering from practically acceptable cracking was rated as acceptable (Δ). Excellent and acceptable rating levels (○ and Δ) are required.

Resolution

A section of the optical waveguide pattern (core layer pattern) was microscopically photographed, and the resulting photograph was observed. A core layer free from collapse and variations of projections thereof as seen in section was rated as excellent (○), and a core layer free from collapse of projections thereof as seen in section but suffering from variations of the projections was rated as acceptable (Δ). Further, a core layer suffering from collapse and variations of projections thereof as seen in section was rated as unacceptable (x). Excellent and acceptable rating levels (○ and Δ) are required.

Tackiness

An uncured film was formed by applying and drying the resin composition (varnish). Then, the surface tackiness of the uncured film was evaluated in the following manner. A SUS plate was placed on the uncured film, and a 3-kg weight was placed on the SUS plate. In this state, the uncured film was allowed to stand overnight. When the SUS plate was thereafter removed from the uncured film, it was checked if the uncured film adhered to the SUS plate. An uncured film having tackiness (surface tackiness) was rated as unacceptable (x), and an uncured film free from tackiness was rated as acceptable (○).

TABLE 1

| | | (g) Example | | | | | | |
|---|---|---|---|---|---|---|---|---|
| | | 1 | 2 | 3 | 4 | 5 | 6 | 7 |
| Lower molecular weight epoxy polymer | A1 | 85 | 90 | 80 | 85 | 85 | 85 | — |
| | A2 | — | — | — | — | — | — | 85 |
| Higher molecular weight epoxy polymer | B1 | 10 | 5 | 15 | 10 | 10 | 10 | — |
| | B2 | — | — | — | — | — | — | 10 |
| Liquid epoxy monomer | | 5 | 5 | 5 | 1 | 10 | 5 | 5 |
| Oxetane monomer | | — | — | — | — | — | 5 | — |
| Ethyl lactate | | 55 | 55 | 55 | 55 | 55 | 55 | 55 |
| Photoacid generator | | 4 | 4 | 4 | 2 | 10 | 4 | 4 |
| Flexibility | | ○ | Δ | ○ | ○ | ○ | ○ | ○ |
| Resolution | | ○ | ○ | Δ | Δ | ○ | ○ | ○ |
| Tackiness | | ○ | ○ | ○ | ○ | ○ | ○ | ○ |

TABLE 2

| | | (g) Comparative Example | | | | | |
|---|---|---|---|---|---|---|---|
| | | 1 | 2 | 3 | 4 | 5 | 6 |
| Lower molecular weight epoxy polymer | A1 | 95 | 75 | — | — | 100 | 85 |
| | A2 | — | — | — | — | — | — |
| Higher molecular weight epoxy polymer | B1 | — | 20 | 80 | 100 | — | 10 |
| | B2 | — | — | — | — | — | — |
| Liquid epoxy monomer | | 5 | 5 | 20 | — | — | 13 |
| Oxetane monomer | | — | — | — | — | — | — |
| Ethyl lactate | | 55 | 55 | 55 | 55 | 55 | 55 |
| Photoacid generator | | 4 | 4 | 4 | 4 | 4 | 4 |

TABLE 2-continued (g)

| | Comparative Example | | | | | |
|---|---|---|---|---|---|---|
| | 1 | 2 | 3 | 4 | 5 | 6 |
| Flexibility | X | O | O | O | X | O |
| Resolution | O | X | X | X | X | O |
| Tackiness | O | O | X | O | O | X |

As can be understood from the above results, the resin compositions of Examples 1 to 6 satisfied both the uncured layer flexibility requirement and the higher patterning resolution requirement without tackiness. Therefore, the resin compositions of Examples 1 to 6 were suitable for the roll-to-roll process and other continuous processes.

On the other hand, the resin compositions of Comparative Examples 1 to 6, which contained the lower molecular weight epoxy polymer (A), the higher molecular weight epoxy polymer (B) and the liquid epoxy monomer (C) in proportions falling outside the ranges specified, failed to provide the same effects as the resin compositions of Examples 1 to 7.

Although specific forms of embodiments of the instant invention have been described above in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. A resin composition for production of an optical waveguide, the resin composition comprising:
    (A) an aromatic multifunctional epoxy polymer having a weight average molecular weight (Mw) of 500 to 5000;
    (B) an aromatic multifunctional epoxy polymer having a weight average molecular weight (Mw) of 10000 to 50000;
    (C) at least one of monofunctional, difunctional and trifunctional liquid aromatic epoxy monomers; and
    (D) a photoacid generator;
        wherein the components (A), (B) and (C) are present in proportions of 80 to 90 parts by weight, 5 to 15 parts by weight, and 1 to 10 parts by weight, respectively, based on a total of 100 parts by weight of the components (A), (B) and (C).

2. The resin composition as set forth in claim 1, further comprising an oxetane monomer.

3. An optical waveguide comprising:
    a core portion for transmission of a light signal; and
    a cladding portion;
    wherein at least one of the cladding portion and the core portion is formed from a resin composition as recited in claim 1.

* * * * *